United States Patent
Fukuhara

[11] Patent Number: 4,774,518
[45] Date of Patent: Sep. 27, 1988

[54] LORAN-C SIGNAL PHASE TRACKING APPARATUS

[75] Inventor: Hiroshige Fukuhara, Yokosuka, Japan

[73] Assignee: Nissan Motor Company, Limited, Japan

[21] Appl. No.: 733,052

[22] Filed: May 9, 1985

[30] Foreign Application Priority Data

May 11, 1984 [JP] Japan ................................ 59-94330

[51] Int. Cl.$^4$ .............................................. G01S 1/24
[52] U.S. Cl. ...................................... 342/389; 364/452
[58] Field of Search ............................... 343/388–390; 364/452; 342/388–390

[56] References Cited

U.S. PATENT DOCUMENTS

| | | | |
|---|---|---|---|
| 3,868,690 | 2/1975 | Miller | 364/452 X |
| 3,868,691 | 2/1975 | Miller et al. | 364/452 X |
| 3,921,076 | 11/1975 | Currie | 343/390 |

OTHER PUBLICATIONS

Automatic Airborne Loran–C Navigator And The Results Of Its Evaluation Test Sane 81-34.

Primary Examiner—Theodore M. Blum
Assistant Examiner—Bernarr Earl Gregory
Attorney, Agent, or Firm—Lowe, Price, LeBlanc, Becker & Shur

[57] ABSTRACT

An apparatus receives Loran-C pulses and tracks the phase of each received Loran-C pulse received from master and secondary stations. The apparatus comprises: (a) a phase comparator (12) for comparing the phase of the Loran-C pulse received from each transmitting station with that of a comparison signal; (b) a phase locked loop circuitry (16) for generating the comparison signal at a given integral multiple of the repetition rate of the Loran-C signal; (c) an S/N ratio detection circuit (14) for measuring the signal-to-noise ratio of the received signal; (d) a loop filter (13) for correcting the timing at which the comparison signal is generated toward coincidence with the phase of the received Loran-C pulse when a given number of phase comparisons by the phase comparator (12) produce results of the same polarity; and (e) a sample number control circuit (15) for adjusting at least one of the given integral multiple and the given number according to the measured signal-to-noise ratio. The phase tracking can thus be achieved with high accuracy even at low signal-to-noise ratios and with far higher accuracy at higher signal-to-noise ratios.

12 Claims, 8 Drawing Sheets

S/N RATIO (dB)

LORAN-C SIGNAL PHASE TRACKING APPARATUS

BACKGROUND OF THE INVENTION

1. Field of the Invention

The present invention relates to a phase tracking apparatus used in a Loran-C navigation system wherein a sampling pulse for capturing a Loran-C signal is accurately synchronized in phase with the received Loran-C signal.

2. Description of the Prior Art

Figure 1A:
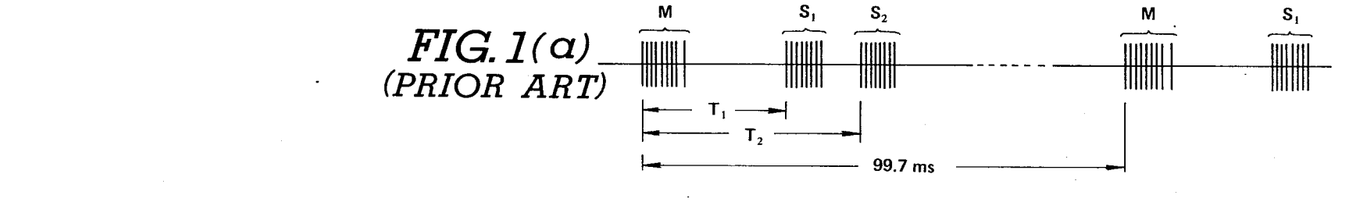
FIGS. 1(a), 1(b) and 1(c) are waveform charts of the Loran-C signal components shown on ever-expanding time axes.
Figure 1B:
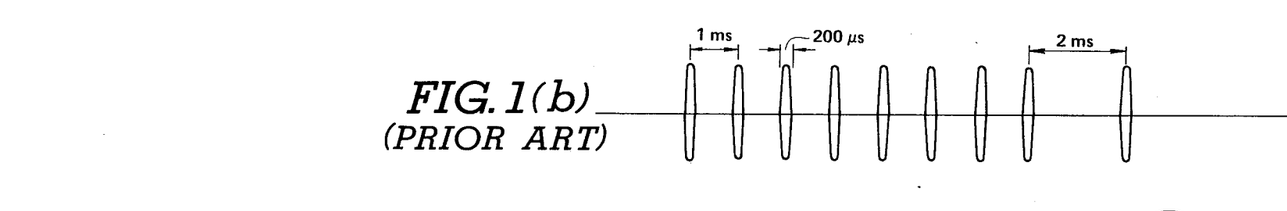
Figure 1C:
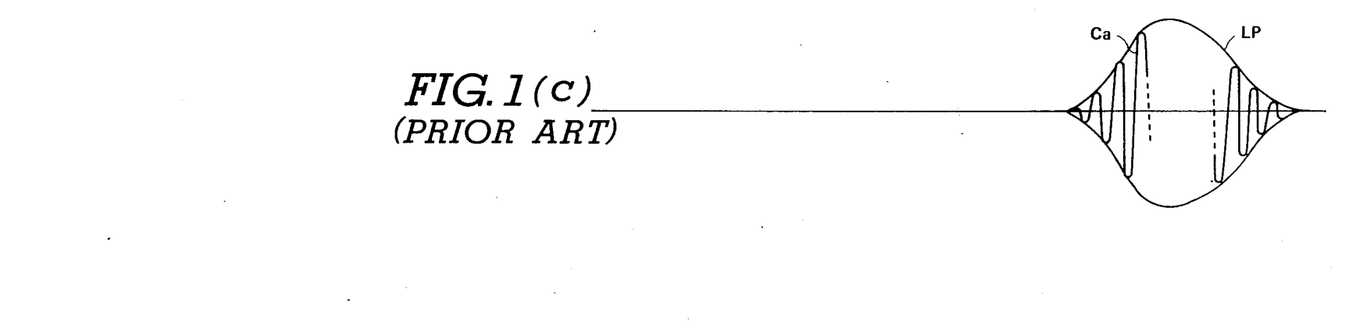

A Loran (Long-range navigation)-C system employs a chain of transmitting stations including one master and two or more secondaries. The master transmitting station periodically transmits groups of nine Loran pulses as denoted by M in (a) of FIG. 1. Each secondary transmitting station similarly transmits eight Loran pulses as denoted by $S_1$ and $S_2$ in (a) of FIG. 1. Each transmitting station generates the above-described Loran pulses at a pulse repetition rate prescribed for each chain (in the Japanese Maritime Area, 99.7 milliseconds). In addition, each secondary transmitting station generates its secondary station Loran pulses at a unique coding delay with respect to the transmissions from the master transmitting station.

Hence, in the Loran-C signal receiving system, the difference in distance to the two fixed points represented by the master and each secondary transmitting station can be derived from the time delays $T_1$ and $T_2$ between receipt of the secondary pulses $S_1$ and $S_2$ and of the master pulses M. Thus, the location of the Loran-C signal receiving system can be identified by the intersection of Loran hyperbolics specified by the distance difference values relative to the known positions of the stations.

In the Loran-C receiving system, a particular cycle of the carrier wave in each received pulse (generally, the third cycle of the carrier wave) is tracked in order to measure the reception delay time of the pulses from the secondary transmitting stations with respect to those from the master transmitting station. The carrier wave $C_a$ of the Loran-C signal has a frequency of 100 kilohertz and, hence, a period of 10 microseconds. Loran-C signal components are described in detail in U.S. patent application Ser. No. 657,662 filed on Oct. 4, 1984, now U.S. Pat. No. 4633260.

Recently, Loran-C navigation systems have been proposed for use in airplanes and automotive vehicles. In this case, the proposed operation of a Loran-C receiving apparatus which uses a digital PLL (Phase-Locked Loop) has been to track the Loran-C pulses which are subject to a noisy environment and which must be picked up by a receiver mounted on a vehicle moving at high speed. (Refer to the document entitled "Automation and Results of Repetition of Loran Receiving System" document No. SANE 81-34 published by Space Navigation Electronics Research group of Electronics and Communication Society).

Figure 2:
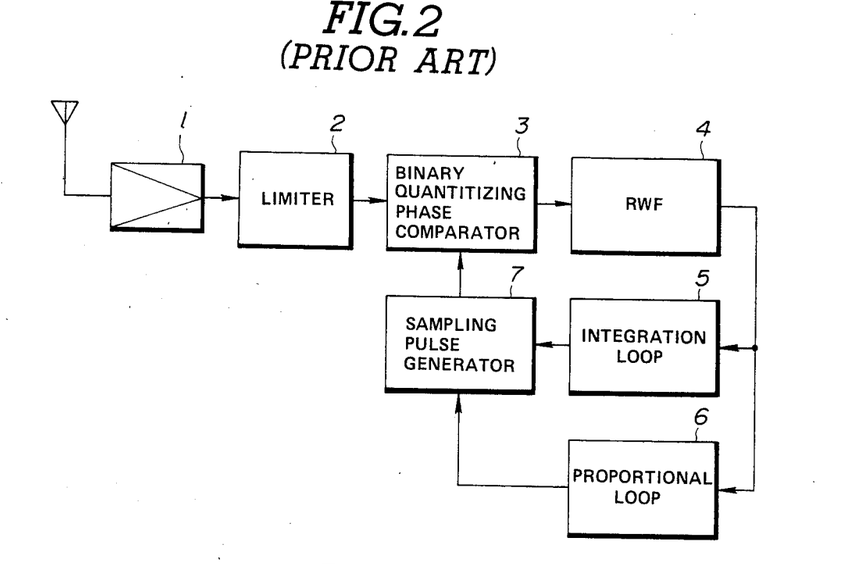
FIG. 2 is a simplified circuit blank diagram of a conventional phase tracking apparatus.

FIG. 2 is a simplified block diagram of the aforementioned conventional PLL Loran-C phase tracking apparatus. The Loran-C signal received via a high-frequency amplifier 1 and a limiter 2 is converted into a binary signal with a frequency matching that of the received signal. The binary signal is then processed to average out the influences of noise by means of a random work filter (abbreviated RWF) and is inputted to a sampling pulse generator 7 via an integration loop 5 and a proportional loop 6.

In the sampling pulse generator 7, a comparison signal related to the input signal level is supplied to a binary quantized phase comparator 3. The comparison signal is used as a sampling pulse for the Loran-C signal.

Figure 3:
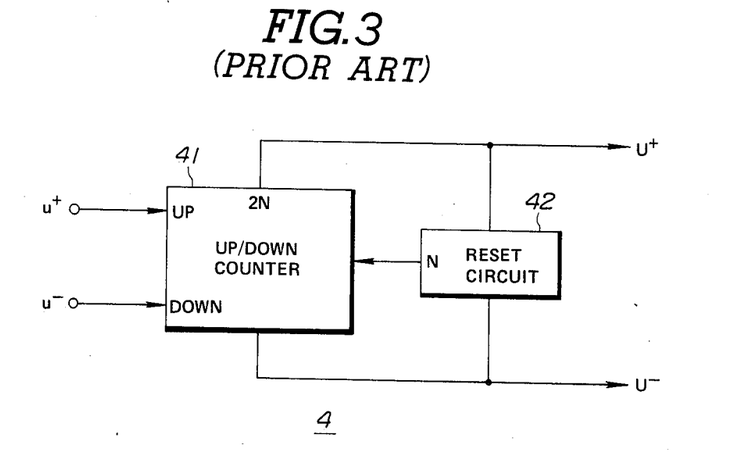
FIG. 3 is an integral circuit block diagram of a random work filter (RWF) shown in FIG. 2.

The phase tracking characteristics of the above phase tracking apparatus are determined by the RWF 4. The RWF 4 comprises an UP/DOWN counter 41 and an N-reset circuit 42, as shown in FIG. 3.

The UP/DOWN counter 41 is reset previously to N by the output signal of the N-reset circuit 42. The UP count and DOWN count (increment and decrement) operations operations of the UP/DOWN counter 41 are carried out in response to the binary output $u+$, $u-$ representing phase advance and phase delay from the binary quantized phase comparator 3.

If the count value reaches either $2N$ or 0, a corresponding output $U+$ or $U-$ is generated and in response to the output $U+$ or $U-$, the count value of the UP/DOWN counter 41 is again reset to N.

Figure 4:
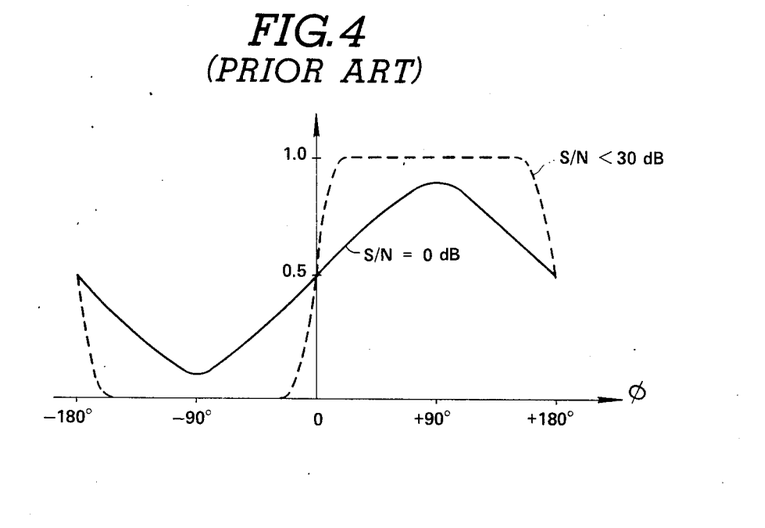
FIG. 4 is a graph of the characteristics of input/output probability of the random work filter relative to the S/N ratio.

FIG. 4 shows the probability of outputting the signal $U+$ representing the phase advance from the binary quantizing phase comparator 3 with respect to a phase difference $\theta$ between the input signal and the comparison signal. The solid curve represents the probability curve for a typically noisy environment, and the dotted curve shows the characteristics for a higher-quality signal. The probability would be 1.0 over the range of $0° \leq \theta < 180°$ and the probability would be 0 over the range of $-180° < \theta < 0$ under ideal, noise-free conditions, in which case the binary quantizing phase comparator 3 would detect the phase without error. However, when noise is present, the probability is adversely affected to a degree dependent on the S/N ratio. As shown in FIG. 4, the probability extrema are centered about the values $\theta = \pm 90°$.

It should also be noted that the zero crossing point of the received carrier wave, i.e. when the signal level is 0 (zero), the output probability is $\frac{1}{2}$, i.e., the probability of outputting either a phase advance or a phase lag signal is $\frac{1}{2}$.

Figure 5:
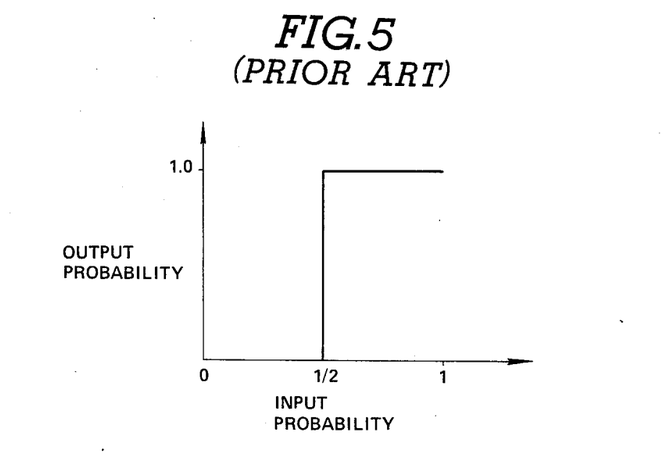
FIG. 5 is a graph of the ideal probability conversion characteristics of a loop filter.

This aspect of the receiver system necessitates conversion of the input and output probability characteristics as shown in FIG. 5 in order to realize the ideal characteristics achieved by noise-free signals even when the received signal is relatively noisy.

Figure 6:
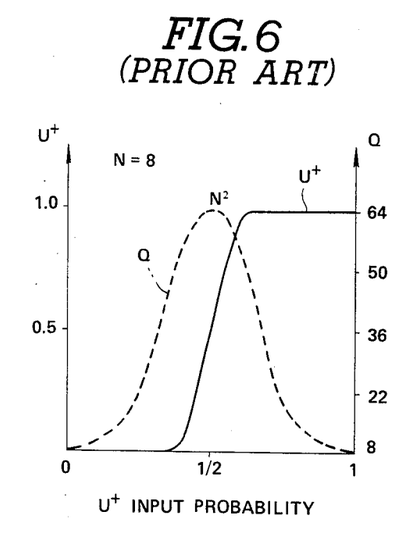
FIG. 6 is a graph of the actual probability conversion characteristics of a typical loop filter.

The above-described RWF 4 is a typical loop filter exhibitting less-than-ideal conversion characteristics. The actual probability conversion characteristics of the RWF 4 are shown in FIG. 6 in the case where the reset value N equals 8. The dotted line Q in FIG. 6 represents the average number of input pulses required for the count value of the UP/DOWN counter 41 to reach $2N$. The value of Q is maximized, i.e., $Q_{max} = N^2$ when the input probability of $U+$ is $\frac{1}{2}$. It should be noted that $U+$ represents a probability of the count value reaching $2N$.

The PLL phase tracking apparatus is so constructed that the phase tracking of the sampling pulse is carried out in accordance with secular variations in the reception timing of the third cycle of the carrier wave due to movement of the Loran-C receiving apparatus after the third cycle of the carrier wave in the Loran-C pulses is detected by the third cycle detection apparatus of the Loran-C receiving system.

However, although the count limit N of the loop filter (in the above-described conventional apparatus, RWF 4) is constant, the S/N ratio of the reception signal varies over a wide range of $-\infty$ dB to over positive one hundred dB. In addition, when the Loran-C receiving system is installed in a vehicle or airplane which moves at a relatively high speed, the phase tracking apparatus may not be ale to follow the phase variations of the carrier wave in the Loran-C signal and of the comparison signal due to errors in the clock signal and thus may not be able to maintain sufficient phase-tracking accuracy.

SUMMARY OF THE INVENTION

With the above-described problems in mind, it is an object of the present invention to provide a phase tracking apparatus for a Loran-C signal which can track the phase of the received signal with great accuracy even when the S/N ratio of the reception signal is low and can improve the phase tracking accuracy when the S/N ratio is high.

Figure 7:
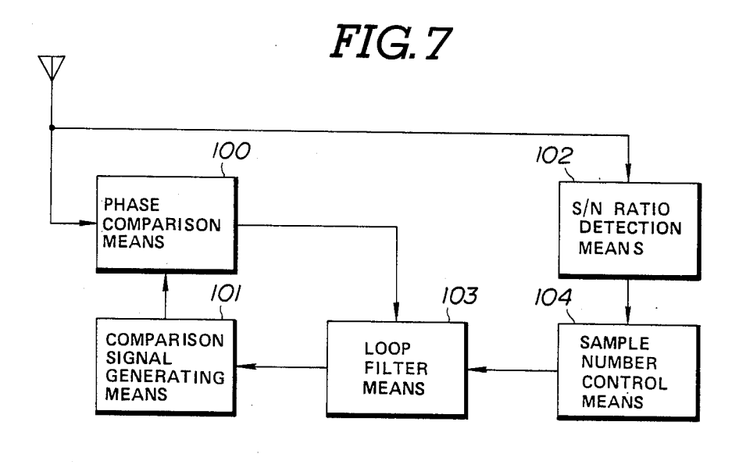
FIG. 7 is a simplified functional block diagram of a phase tracking apparatus for a Loran-C signal according to the present invention.

This can be achieved by providing a phase tracking apparatus for a Loran-C signal comprising, as shown in FIG. 7, (a) first means for comparing the phase of the Loran-C pulse received from each transmitting station with that of a comparison signal; (b) second means for generating the comparison signal at a given integral multiple of the repetition rate of the Loran-C signal; (c) third means for measuring the signal-to-noise ratio of the received signal; (d) fourth means for correcting the timing at which the comparison signal is generated toward coincidence with the phase of the received Loran-C pulse when a given number of phase comparisons by the first means produce results of the same polarity; and (e) fifth means for adjusting at least one of the given integral multiple and the given number according to the measured signal-to-noise ratio.

BRIEF DESCRIPTION OF THE DRAWINGS

A more complete understanding of the present invention may be obtained from the following detailed description in conjunction with the attached drawings in which.

DETAILED DESCRIPTION OF THE PREFERRED EMBODIMENT

Reference will hereinafter be made to the drawings in order to facilitate understanding of the present invention.

Figure 8:
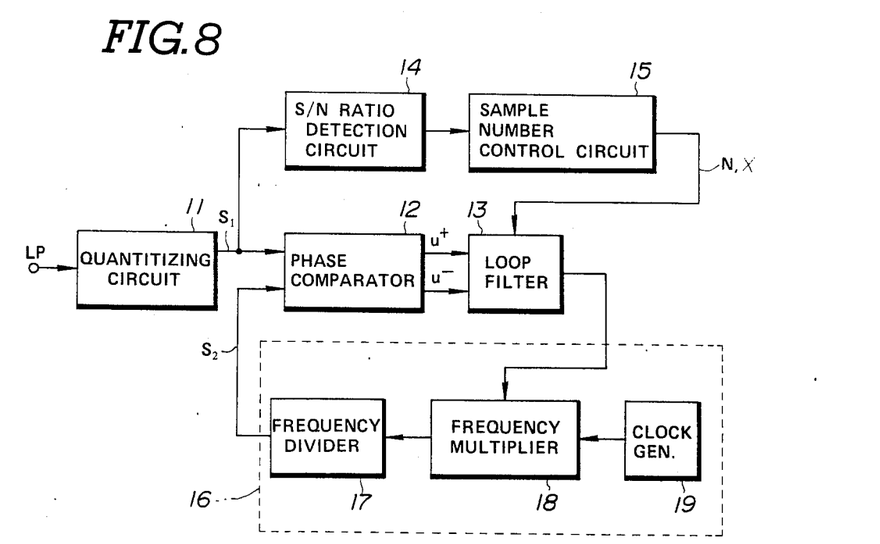
FIG. 8 is a simplified circuit block diagram of a first preferred embodiment.

FIG. 8 shows a preferred embodiment of the phase tracking apparatus according to the present invention.

In FIG. 8, a quantizing circuit 11 outputs a binary signal $S_1$ whose frequency matches that of the received Loran-C pulse signal LP similarly to the limiter 2 shown in FIG. 2. A phase comparator 12 receives the binary signal $S_1$ from the quantizing circuit 11 and a comparison signal $S_2$ from a frequency divider 17, compares the phases of the received binary signal $S_1$ and the comparison signal $S_2$, and outputs a phase advance signal $u^+$ or a phase lag signal $u^-$ to a loop filter 13 according to the results of the comparison similarly to the binary quantized phase comparator 3 shown in FIG. 2.

The loop filter 13 is a random work filter of the same construction as shown in FIG. 2 and FIG. 3. The loop filter 13 is connected for output to a frequency multiplier 18 which increases or decreases the number of pulses in the clock signal from a clock generator 19.

The frequency divider 17 divides the frequency of the clock signal, after increase or decrease by the frequency multiplier 18, by a predetermined frequency-division ratio and outputs the frequency-divided clock signal as the comparison signal $S_2$. It should be noted that the frequency divider 17, the frequency multiplier 18, and the clock generator 19 constitute a Voltage Controlled Oscillator (VCO) for the PLL. The S/N ratio detection circuit 14 detects the signal-to-noise ratio of the received signal. The structure of the S/N ratio detection circuit 14 is exemplified by U.S. patent application Ser. No. 617,938 filed on June 6, 1984 to the same Applicant, the contents of which are hereby incorporated by reference.

In brief, the S/N ratio detection circuit exemplified in the above-identified U.S. Patent Application comprises: (a) means for repeatedly sampling the instantaneous amplitude of the received signal at predetermined phases by a predetermined number of times; (b) means for discriminating whether or not the sampled value is greater than a predetermined reference value; (c) means responsive to the received signal being sampled the predetermined number of times for calculating at least one of a first proportion of sampled values which exceed the reference value and a second proportion of sampled values which are less than the reference value; and (d) means for deriving the signal-to-noise ratio of the received signal on the basis of at least one of the first and second proportions of the sampled values, and the S/N ratio deriving means include means for calculating $(M_1-M_2)/(M_1+M_2)$ wherein $M_1$ and $M_2$ denote the first and second proportion, respectively, and the first and second proportions $M_1$ and $M_2$ are given by $M_1 = Q \times A_1$ and $M_2 = Q \times A_2$, respectively, wherein Q denotes the predetermined number of times, $A_1$ denotes a probability density function expressed by $$\frac{1}{\sqrt{2\pi\sigma^2}} \int_0^\infty e^{-\frac{(n-S)^2}{2\sigma^2}} dn,$$

$A_2$ denotes the probability density function expressed by $$\frac{1}{\sqrt{2\pi\sigma^2}} \int_{-\infty}^0 e^{-\frac{(n-S)^2}{2\sigma^2}} dn,$$

wherein n denotes the sampled amplitude of noise contained in the received signal, S denotes the sampled amplitude of the received signal, and $\sigma$ denotes a standard deviation of n.

Figure 12:
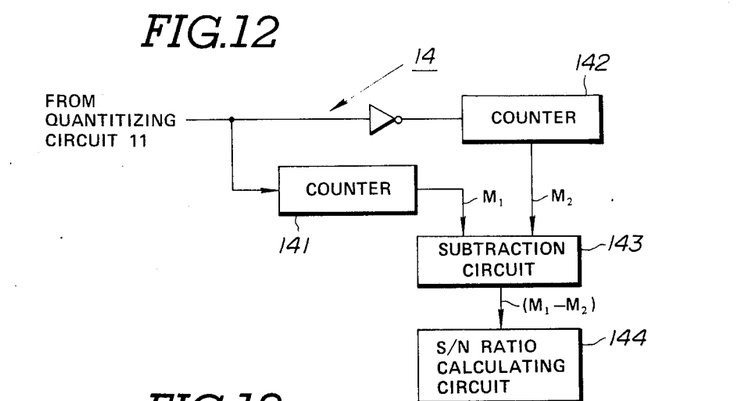
FIG. 12 is a simplified circuit block diagram of an example of a signal-to-noise (S/N) ratio detection circuit according to the present invention.

Alternatively, the S/N ratio detection circuit 14 may comprise, as shown in FIG. 12, (a) a counter 141 which counts the output signals $B_c(S_1)$ from the quantizing circuit 11 at logical level "1"; (b) a counter 142 which counts the output signals $B_c(S_1)$ at logical level "0", being connected behind an inverter; (c) a subtraction circuit 143 which subtracts the count value $M_2$ from the count value $M_1$ from the respective counters 142 and 141; and (d) a S/N ratio calculation circuit 144 which calculates the signal-to-noise ratio of the received signal on the basis of the value $(M_1 - M_2)$ output by the subtraction circuit 143.

It should be noted that the quantizing circuit 11, for example, outputs a logical "1" when the sampled amplitude of the Loran-C signal LP is at a positive level and outputs a logical "0" when the sampled amplitude is at a negative level. The S/N ratio calculating circuit 144 comprises a microcomputer including a Central Processing Unit (CPU), Random-Access Memory (RAM), Read-Only Memory (ROM), and Input/Output Port. The ROM is previously loaded with S/N ratio values corresponding to the subtraction values $(M_1 - M_2)$ from the subtraction circuit 143 and the CPU together with the RAM derives the S/N ratio from the relationship between the memory contents of the ROM and the current subtraction value. In general, noise can be deemed to be random noise following a Gaussian noise distribution. If the instantaneous amplitude of noise $N_Z$ is n, the probability distribution P(n) of the instantaneous amplitude n has an average value of zero as appreciated from FIG. 13 and has a probability density function following a Gaussian distribution with a dispersion value of $\sigma^2$, wherein $\sigma$ denotes the standard deviation. The probability density function P(n) can be expressed by the following equation:

$$P(n) = \frac{1}{\sqrt{2\pi\sigma^2}} e^{-\frac{n^2}{2\sigma^2}} \quad (1)$$

In the above equation (1), $\sigma^2$ corresponds to noise power and $\sigma$ corresponds to its effective value.

Therefore, in a case when pure noise $N_Z$ is sampled and quantized by the quantizing circuit 11, the probability of the output signal $B_c$ being a logical "1" is equal to that of the output signal being a logical "0" and, thus, the output value $M_1$ of the counter 141 should equal the output value $M_2$ of the counter 142. Consequently, the output value $(M_1 - M_2)$ of the subtraction circuit 143 will be zero, representing a S/N ratio of $-\infty$ dB, in agreement with a received signal of pure noise $N_Z$.

Figures 14A, 14B:
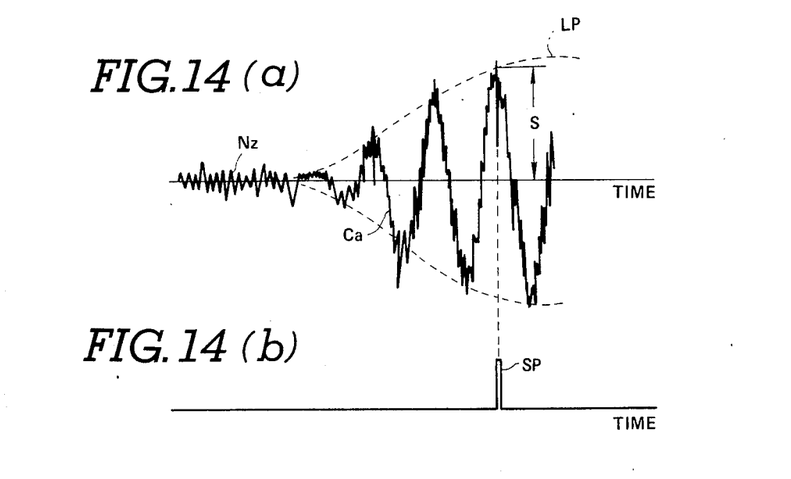
FIG. 14 is a waveform chart showing the relationship between Loran-C pulses and sampling pulses in the apparatus shown in FIG. 8.

As shown in FIG. 14, if the sampling pulse SP supplied to the quantizing circuit 11 is synchronized with peaks of the carrier wave $C_a$ of the Loran-C pulse LP, the sampled amplitude will be a negative value if the amplitude of the carrier wave $C_a$ is S and the amplitude n of the noise $N_Z$ is $n < -S$. In this case, the output signal $B_c$ of the quantizing circuit 11 would be a logical "0". On the other hand, the sampled amplitude would be a positive value if the amplitude n of the noise $N_Z$ is $n > -S$. In this case, the output signal $B_c$ of the quantizing circuit 11 would be a logical "1".

Figure 13:
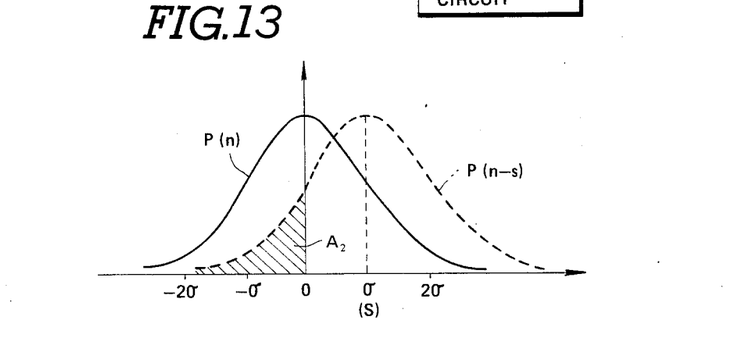
FIG. 13 is a graph of the probability distribution of the sampled amplitude of the apparatus shown in FIG. 8.

In this way, the probability distribution of received signal amplitude after N samples taken at a peak of the carrier wave $C_a$ of the Loral-C pulse LP has an average value S and follows a Gaussian distribution with dispersion $\sigma^2$, as shown by a dotted line P(n-S) in FIG. 13. This is the same as translating the probability distribution P(n) for pure noise by S in the positive direction. The probability density function P(n-S) in this case can be expressed by the following equation:

$$P(n - S) = \frac{1}{\sqrt{2\pi\sigma^2}} e^{-\frac{(n-S)^2}{2\sigma^2}} \quad (2)$$

The area $A_2$ of the hatched region accenting the negative range of probability distribution P(n-S) is equal to the probability of the sampled amplitude being a negative value. In addition, the probability $A_1$ of the sampled amplitude being a positive value is $1 - A_2$.

Hence, the output value $M_2$ of the counter 142 after N samples have been taken is expressed as:

$$\begin{aligned} M_2 &= N \times A_2 \\ &= N \times \frac{1}{\sqrt{2\pi\sigma^2}} \int_{-\infty}^0 e^{-\frac{(n-S)^2}{2\sigma^2}} dn \end{aligned} \quad (3)$$

On the other hand, the output value $M_1$ of the counter 141 can be expressed as:

$$M_1 = N - M_2 = N(1 - A_2) \quad (4)$$

Hence, the difference between the count values $M_1$ and $M_2$ can be expressed as:

$$\begin{aligned} M_1 - M_2 &= N(1 - A_2) - NA_2 \\ &= N(1 - 2A_2) \end{aligned} \quad (5)$$

Since the average value S of the probability density function P(n-S) of the sampled amplitude is $\sigma (S = \sigma)$, P(n-S) corresponds to the case wherein the S/N ratio is 0 dB. The difference $(M_1 - M_2)$ between the count value $M_1$ and count value $M_2$ is derived from the above equation (5).

$$M_1 - M_2 = N\left(1 - \frac{2}{\sqrt{2\pi\sigma^2}} \int_{-\infty}^{\sigma} e^{-\frac{(n-S)^2}{2\sigma^2}} dn\right)$$

$$= N(1 - 2 \times 0.1587)$$

$$= 0.6826N$$

That is to say, if the difference $(M_1-M_2)$ is 0.6826N, the S/N ratio is 0 dB.

Figure 15:
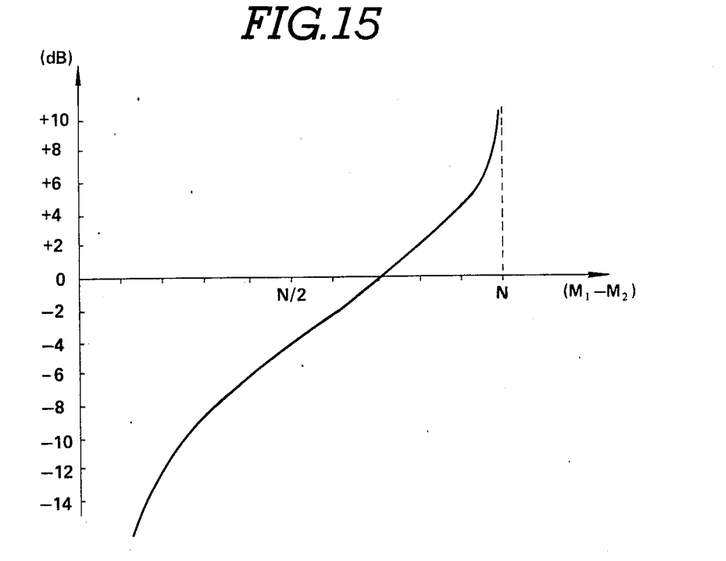
FIG. 15 is a graph of one possible relationship between the value calculated by the apparatus shown in FIG. 8 and the signal-to-noise (S/N) ratio.

The relationship between the difference value $(M_1-M_2)$ and S/N ratio can be expressed as the quadratic curve shown in FIG. 15.

Hence, if the memory of the above-described S/N ratio calculation circuit 144 is previously loaded with data derived from the graph shown in FIG. 15, the S/N ratio can be calculated from the output value $(M_1-M_2)$ of the above-decribed subtraction circuit 143. It should be noted that although in the above-described example of the S/N ratio detection circuit 14 comprises two counters 141, 142 which count occurrences of both logical "1" and "0" values of the output binary signal of the quantizing circuit 11, the number of counters can be limited to one by the following technique: given either one of the two count values $M_1$ or $M_2$, the other count value can be calculated from the previously set number of samples N.

Figure 16:
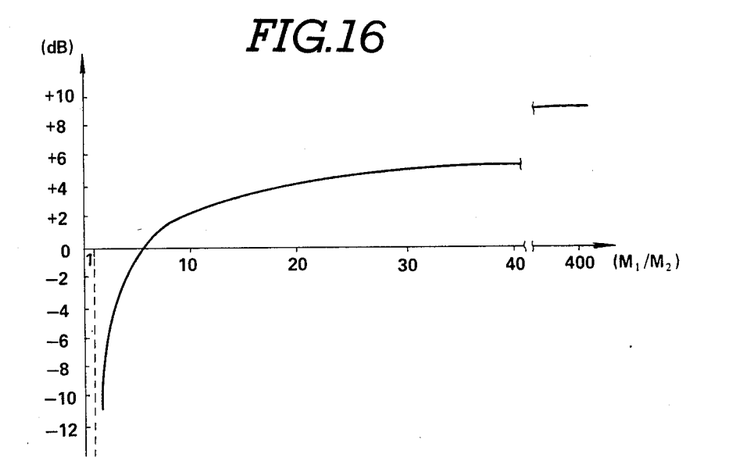
FIG. 16 is a graph of another relationship between the value calculated by the apparatus shown in FIG. 8 and the signal-to-noise ratio.

Alternatively, the S/N ratio can be obtained from the relationship between the S/N ratio and the ratio $(M_1/M_2)$ between the two count values $M_1$ and $M_2$ as shown in FIG. 16. In this case as well, it is possible to deduce the relationship with the S/N ratio from either of the count values $M_1$, $M_2$.

A sample number control circuit 15 selects a suitable value of N for the N-reset circuit 42 shown in FIG. 3, i.e., for the "constant" number in the loop filter 13 and for a sampling rate factor X, by which the frequency of the clock signal is multiplied, in accordance with the S/N ratio detected by the S/N ratio detection circuit 14. The determined value N and the factor X are sent to the loop filter 13. The numbers N and X determined by the sample number control circuit 15 are selected according to the characteristics shown in FIG. 9.

If the division ratio of the division circuit 17 is R, the resulting phase change $\Delta$ in the output $S_2$ of the frequency divider 17 can be expressed as follows:

$$\Delta = 360° \times n/R$$

As the sampling factor X decreases, the phase error drops monotonically but the response to changes in phase of the input signal is retarded. On the other hand, as the sampling factor X increases, the phase error also increases while the responsiveness improves.

When the S/N ratio is very high (+10 dB or more), the average number Q of sampled data required for the control signal to be outputted by the loop filter 13 as shown in FIG. 6 may be safely reduced and hence the value of the constant number N may also be decreased (in this embodiment, N=4). In this case, since each sampling cycle can be completed in a very short time, the phase tracking can be performed with sufficient accuracy even with the sampling rate factor X set to its minimum value, i.e. one. Thus, phase tracking with extremely high accuracy can be achieved.

In the noise range −5 through +10 dB in which noise begins to have some influence, it is necessary to increase the average number of samples Q so that the preset value N is increased (in this embodiment, N=8). In this range, the time required for one sampling cycle is still not very long and hence the phase can be tracked with sufficiently high accuracy even though the sampling rate factor X remains at the value one.

When the S/N ratio drops into the range −15 through −5 dB or −15 dB or less), it becomes necessary to further increase the value of N and correspondingly increase the factor X due to the prolonged sampling cycle. In this case, the increase in the factor X can prevent the so-called cycle-slip phenomenon in which tracking point shifts by one or more several cycles of the carrier wave. This also improves the responsiveness of the system to changes in the phase of the input signal.

These effects can be compared to the behavior of a conventional apparatus in which the numbers N, X in the loop filter are constant. The phase difference $\theta$ between the comparison signal $S_2$ and the received signal $S_1$ in the conventional apparatus increases with time and finally exceeds 180° when the S/N ratio is equal to $-\infty$ dB (no signal), as indicated by a in FIG. 10. In this case, since the phase comparator 12 outputs a very noisy phase comparison result, the phase tracking perform control of phase advance and phase lag is essentially random and exhibits characteristics such as are shown in FIG. 10.

If the S/N ratio improves thereafter, the tracking point (0°) may be shifted to the point 360° rather than back to 0°, i.e. cycle slip will occur.

Figure 10:
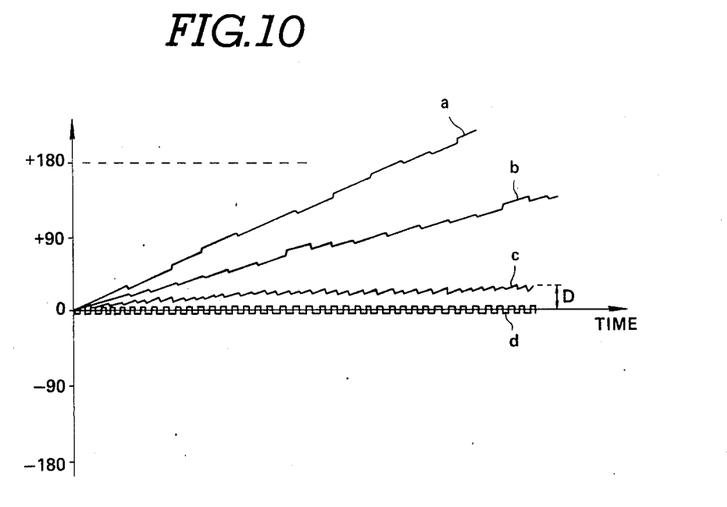
FIG. 10 shows the phase tracking characteristics of a conventional apparatus.

The above-described state may also occur in the case of a moderately low S/N ratio as indicated by b of FIG. 10 and the cycle slip cannot be avoided.

If the S/N ratio is high (in FIG. 10, as indicated by c and d), the phase difference $\theta$ will settle quickly to a predetermined phase, the error being held to a level determined by X (in FIG. 10, D). The constant phase difference D represents the positional measurement delay with respect to the present position of a moving object on which the Loran-C receiving system is mounted.

Figure 11:
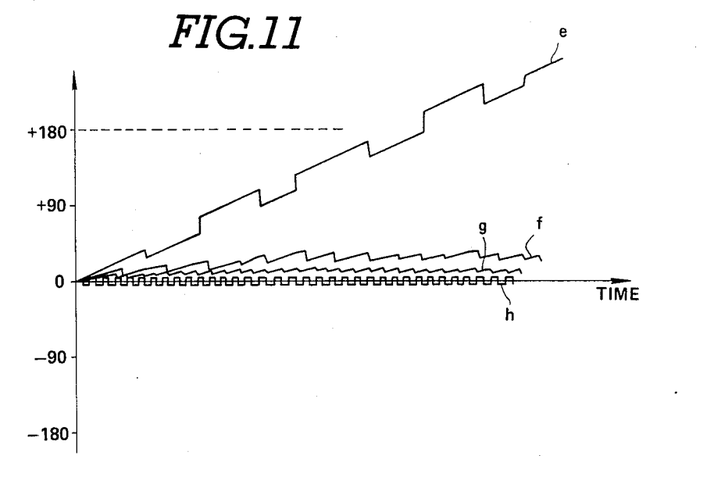
FIG. 11 shows the phase tracking characteristics of the apparatus shown in FIG. 8.

On the other hand, as shown in FIG. 11 (e,f,g, and h in FIG. 11 correspond to the S/N ratios in a, b, c, and d respectively in FIG. 10), the apparatus in this embodiment will have essentially the same phase error as the conventional apparatus in the case when the S/N ratio is $-\infty$ dB. However, the apparatus in this embodiment exhibits extremely small phase errors at higher S/N ratios so that the phase tracking can be carried out with high accuracy even if the Loran-C signal is received at extremely low amplitudes, as indicated by f, g, and h of FIG. 11.

In addition, it is possible to minimize the delay D in the conventional apparatus so that phase tracking with high accuracy can always be achieved even if the S/N ratio should vary over a wide range.

It should be noted that although the tracking apparatus in this embodiment has been shown to consist of discrete electronic circuits as shown in FIG. 8, a software control of phase tracking can easily be achieved using a microcomputer. It should also be noted that the above loop filter is not limited to the random work filter (RWF) shown but may alternatively exhibit probability conversion characteristics (as in N-before-M filters).

Figure 9:
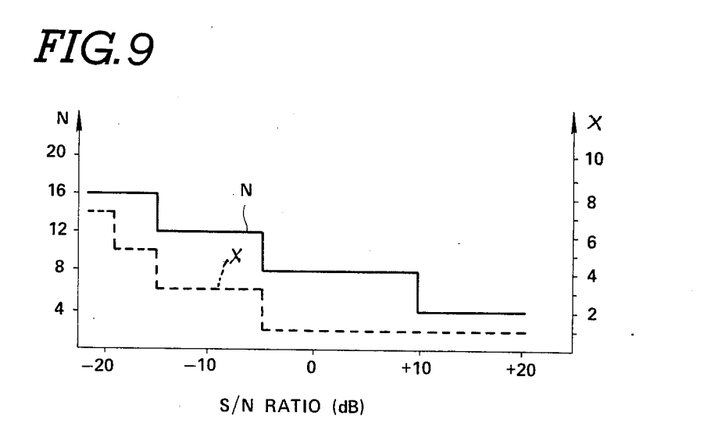
FIG. 9 is a graph of the characteristics of a constant number control circuit shown in FIG. 8.

Furthermore, the characteristics of the sample number control circuit 15 (shown in FIG. 9) is not limited to the characteristics shown in FIG. 9 but may be adjusted appropriately.

As described hereinbefore, the phase tracking apparatus according to the present invention can always track the phase of the received LORAN signal accurately even if the signal-to-noise (S/N) ratio of the received signal varies over a wide range and can track the phase with far higher accuracy at good (high) S/N ratios. Hence, even if the apparatus is installed in fast-moving vehicles such as automobiles or airplanes, the apparatus can follow changes in the phase of the received signal.

It should be fully understood by those skilled in the art that the foregoing description is made in terms of a preferred embodiment and various changes and modifications can be made without departing from the scope of the present invention, which is to be defined by the appended claims.

What is claimed is:

1. An apparatus for receiving Loran-C pulses and tracking the phase of the received Loran-C pulses from master and secondary stations, comprising:
   (a) first means for comparing the phase of the Loran-C pulse received from each transmitting station with that of a comparison signal;
   (b) second means for generating the comparison signal at a given integral multiple of the repetition rate of the Loran-C signal;
   (c) third means for measuring the signal-to-noise ratio of the received signal;
   (d) fourth means for correcting the timing at which the comparison signal is generated toward coincidence with the phase of the received Loran-C pulse when a given number of phase comparisons by said first means produce results of the same polarity; and
   (e) fifth means for adjusting at least one of said given integral multiple and said given number according to the measured signal-to-noise ratio.

2. The apparatus according to claim 1, which further comprises a quantizing circuit for producing a binary signal representing the polarity of the received signal at a frequency synchronous with the received Loran-C signal.

3. An apparatus for receiving Loran-C pulses and tracking the phase of the received Loran-C pulses from master and secondary stations, comprising:
   (a) first means for comparing the phase of the Loran-C pulse received from each transmitting station with that of a comparison signal;
   (b) second means for generating the comparison signal at a given integral multiple of the repetition rate of the Loran-C signal;
   (c) third means for sampling the received signal a predetermined number of times and measuring the signal-to-noise ratio of the received signal;
   (d) fourth means for correcting the timing at which the comparison signal is generated toward coincidence with the phase of the received Loran-C pulse when a given number of phase comparisons by said first means produce results of the same polarity;
   (e) fifth means for adjusting at least one of said given integral multiple and said given number according to the measured signal-to-noise ratio; and
   a quantizing circuit for producing a binary signal representing the polarity of the received signal at a frequency synchronous with the received Loran-C signal, wherein said fourth means comprises:
   a random work filter having an UP/DOWN counter which increments its value in response to each binary output signal from said first means indicating phase advance and decrements its value in response to another binary output signal from said first means indicating phase lag; and
   an N-reset circuit which presets said UP/DOWN counter to a value N, said UP/DOWN counter producing a first output signal when its value reaches 2N and a second output signal upon reaching zero, said N-reset circuit being activated by said first and second signals.

4. The apparatus according to claim 3, wherein said third means comprises: (a) a first counter which counts the number of signals from said quantizing circuit representing positive polarity; (b) a second counter which counts the number of signals from said quantizing circuit representing non-positive polarity; (c) a subtraction circuit for subtracting the count value of said second counter from that of said first counter; and (d) a signal-to-noise ratio calculating circuit for calculating the signal-to-noise ratio on the basis of the difference derived by said subtraction circuit.

5. The apparatus according to claim 4, wherein said second means comprises: (a) a clock generator which generates a clock pulse with a predetermined frequency; (b) a clock frequency multiplier which increases the clock frequency by a given integral factor selected according to the output signal from said S/N ratio calculating circuit; and (c) a frequency divider for dividing the frequency of the output of said clock frequency muliplier by a predetermined division ratio and sending the divided clock pulse to said first means.

6. The apparatus according to claim 5, wherein said fifth means, in accordance with the detected signal-to-noise ratio and via said random work filter, changes the preset value N of said N-reset circuit and the given integral factor by which the clock frequency is multiplied.

7. The apparatus according to claim 6, wherein the reset value of the N-reset circuit is reduced as the detected signal-to-noise ratio increases.

8. The apparatus according to claim 6, wherein said given integral factor is decreased as the detected signal-to-noise ratio increases.

9. An apparatus for receiving Loran-C pulses and tracking the phase of the received Loran-C pulses from master and secondary stations, comprising:
   (a) first means for comparing the phase of the Loran-C pulse received from each transmitting station with that of a comparison signal;
   (b) second means for generating the comparison signal at a given integral multiple of the repetition rate of the Loran-C signal;
   (c) third means for sampling the received signal a predetermined number of times and measuring the signal-to-noise ratio of the received signal on the basis of the sampled result;
   (d) fourth means for correcting the timing at which the comparison signal is generated toward coincidence with the phase of the received Loran-C pulse when a given number of phase comparisons by said first means produce results of the same polarity; and
   (e) fifth means for adjusting at least one of said given integral multiple and said given number according to the measured signal-to-noise ratio.

10. An apparatus for receiving Loran-C pulses and tracking the phase of the received Loran-C pulses from master and secondary stations, comprising:

(a) first means for comparing the phase of the Loran-C pulse received from each transmitting station with that of a comparison signal;

(b) second means for generating the comparison signal at a given integral multiple of the reception rate of the Loran-C signal;

(c) third means for sampling the received signal a predetermined number of times and measuring the signal-to-noise ratio of the received signal on the basis of the sampled result;

(d) fourth means for correcting the timing at which the comparison signal is generated toward coincidence with the phase of the received Loran-C pulse when a given number of phase comparisons by said first means produce results of the same polarity; and (e) fifth means for adjusting at least one of said given integral multiple and said given number according to the measured signal-to-noise ratio, wherein said fifth means is responsive to said third means and adjusts at least one of said given integral multiple and said given number based on the signal-to-noise ratio measured by said third means.

11. An apparatus for receiving Loran-C pulses and tracking the phase of the received Loran-C pulses from master and secondary stations, comprising:

(a) first means for comparing the phase of the Loran-C pulse received from each transmitting station with that of a comparison signal;

(b) second means for generating the comparison signal at a given integral multiple of the repetition rate of the Loran-C signal;

(c) third means for sampling the received signal a predetermined number of times and measuring the signal-to-noise ratio of the received signal;

(d) fourth means for correcting the timing at which the comparison signal is generated toward coincidence with the phase of the received Loran-C pulse when a given number of phase comparisons by said first means produce results of the same polarity; and (e) fifth means for adjusting at least one of said given integral multiple and said given number according to the measured signal-to-noise ratio, wherein said fifth means is responsive to said third means and adjusts at least one of said given integral multiple and said given number based on the signal-to-noise ratio measured by said third means.

12. For use with Loran-C receiver, an apparatus for tracking a phase of received Loran-C pulses from master and secondary transmitting stations, comprising:

(a) first means for comparing the phase of a specific cycle point of a carrier of the Loran-C pulse received from each transmitting station with the phase of a comparison signal;

(b) second means for generating the comparison signal at a given multiple of a repetition rate of the received Loran-C signal;

(c) third means for calculating a signal-to-noise ratio of the received signal; and (d) fourth means for correcting the timing at which the comparison signal is generated toward coincidence with the phase of the received Loran-C pulse signal on the basis of the result of the phase comparison by the first means with an accuracy dependent on the calculated signal-to-noise ratio.

* * * * *